United States Patent
Bloom et al.

(10) Patent No.: US 10,282,675 B2
(45) Date of Patent: May 7, 2019

(54) PERFORMING A CALIBRATION PROCESS IN A QUANTUM COMPUTING SYSTEM

(71) Applicant: Rigetti & Co, Inc., Berkeley, CA (US)

(72) Inventors: Benjamin Jacob Bloom, Oakland, CA (US); Shane Arthur Caldwell, Oakland, CA (US); Michael James Curtis, Sacramento, CA (US); Matthew J. Reagor, Corte Madera, CA (US); Chad Tyler Rigetti, Emeryville, CA (US); Eyob A. Sete, Walnut Creek, CA (US); William J. Zeng, Berkeley, CA (US); Peter Jonathan Karalekas, Berkeley, CA (US); Nikolas Anton Tezak, Berkeley, CA (US); Nasser Alidoust, Berkeley, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 15/916,367

(22) Filed: Mar. 9, 2018

(65) Prior Publication Data
US 2018/0260732 A1    Sep. 13, 2018

Related U.S. Application Data

(60) Provisional application No. 62/469,648, filed on Mar. 10, 2017.

(51) Int. Cl.
*G06N 99/00* (2019.01)
*H03K 19/195* (2006.01)

(52) U.S. Cl.
CPC ......... *G06N 99/002* (2013.01); *H03K 19/195* (2013.01)

(58) Field of Classification Search
None
See application file for complete search history.

(56) References Cited

U.S. PATENT DOCUMENTS

| 2,653,243 A | 9/1953 | McClellan |
| 3,406,353 A | 10/1968 | Mueller |

(Continued)

FOREIGN PATENT DOCUMENTS

WO    2009/143166    11/2009

OTHER PUBLICATIONS

Dicarlo, et al., "Demonstration of Two-Qubit Algorithms with a Superconducting Quantum Processor", arXiv:0903.2030v2, May 4, 2009, 12 pgs.

(Continued)

*Primary Examiner* — Jany Richardson
(74) *Attorney, Agent, or Firm* — Henry Patent Law Firm PLLC

(57) ABSTRACT

In a general aspect, calibration is performed in a quantum computing system. In some cases, domains of a quantum computing system are identified, where the domains include respective domain control subsystems and respective subsets of quantum circuit devices in a quantum processor of the quantum computing system. Sets of measurements are obtained from one of the domains and stored in memory. Device characteristics of the quantum circuit devices of the domain are obtained based on the set of measurements, and the device characteristics are stored in a memory of the control system. Quantum logic control parameters for the subset of quantum circuit devices of the domain are obtained based on the set of measurements and stored in memory.

20 Claims, 7 Drawing Sheets

(56) References Cited

U.S. PATENT DOCUMENTS

| | | | |
|---|---|---|---|
| 7,135,701 | B2 | 11/2006 | Amin et al. |
| 8,089,286 | B2 | 1/2012 | Silva et al. |
| 9,438,246 | B1 | 9/2016 | Naaman |
| 9,940,212 | B2 | 4/2018 | Kelly |
| 2004/0173792 | A1 † | 9/2004 | Blais et al. |
| 2011/0060780 | A1 | 3/2011 | Berkley et al. |
| 2011/0133770 | A1 † | 6/2011 | Przybysz et al. |
| 2011/0175062 | A1 † | 7/2011 | Farinelli et al. |
| 2012/0319085 | A1 † | 12/2012 | Gambetta et al. |
| 2014/0229722 | A1 † | 8/2014 | Harris |
| 2016/0267032 | A1 | 9/2016 | Rigetti et al. |

OTHER PUBLICATIONS

Newville, M., et al., "Non-Linear Least-Squares Minimization and Curve-Fitting for Python", Release 0.9.3, Mar. 27, 2016, 94 pages.

Reagor, Matthew James, "Superconducting Cavities for Circuit Quantum Electrodynamics", Dissertation, Yale University, Dec. 2015, 220 pgs.

Reed, Matthew D., "Entanglement and Quantum Error Correction with Superconducting Qubits", arXiv:1311.6759v1, Nov. 26, 2013, 370 pgs.

Stenberg, M. P. V, et al., "Characterization of decohering quantum systems: Machine learning approach", arXiv:1510.05655v1 [quant-ph], Oct. 19, 2015, 8 pages.

WIPO, International Search Report and Written Opinion dated Jul. 16, 2018, in PCT/US2018/021652.

† cited by third party

PERFORMING A CALIBRATION PROCESS IN A QUANTUM COMPUTING SYSTEM

CROSS-REFERENCE TO RELATED APPLICATIONS

This application claims priority to U.S. Provisional Application No. 62/469,648 entitled "Performing a Calibration Process in a Quantum Computing System" and filed Mar. 10, 2017, which is hereby incorporated by reference.

BACKGROUND

The following description relates to performing a calibration process in a quantum computing system.

In some quantum computing architectures, qubits are implemented in superconducting circuits. The qubits can be implemented, for example, in circuit devices that include Josephson junctions. In some systems, circuit devices in a superconducting circuit are controlled by an external control module.

DETAILED DESCRIPTION

In some aspects of what is described here, a calibration process provides more efficient and accurate initialization of devices and operations in a quantum computing system.

In some implementations, a calibration process provides automated system "bring-up" for a large-scale quantum computer system. As an example, the calibration process may utilize design parameters, measured values, and automatic optimization to determine operating parameters for a multi-qubit system after installing the system in an operating environment (e.g., in a dilution refrigerator), so that the system can be efficiently accessed as working or identified as sub-optimal. In some cases, complicated characterization processes can be divided into sub-processing units that can be scaled up and applied to large systems. For instance, defining a precise calibration sequence may allow rapid characterization of specialized processors.

In some implementations, a central computer process dispatches bring-up instructions to several sub-processing units to assess a superconducting quantum circuit system. The sub-processing units can characterize the circuit devices and tune up quantum logic gates for computation. Both the characterization and the tune-up may follow a defined procedure. By subdividing bring-up tasks with a defined pass/fail criteria based on design and performance, a complex system can be brought up, characterized, and efficiently tuned-up.

Figure 1:
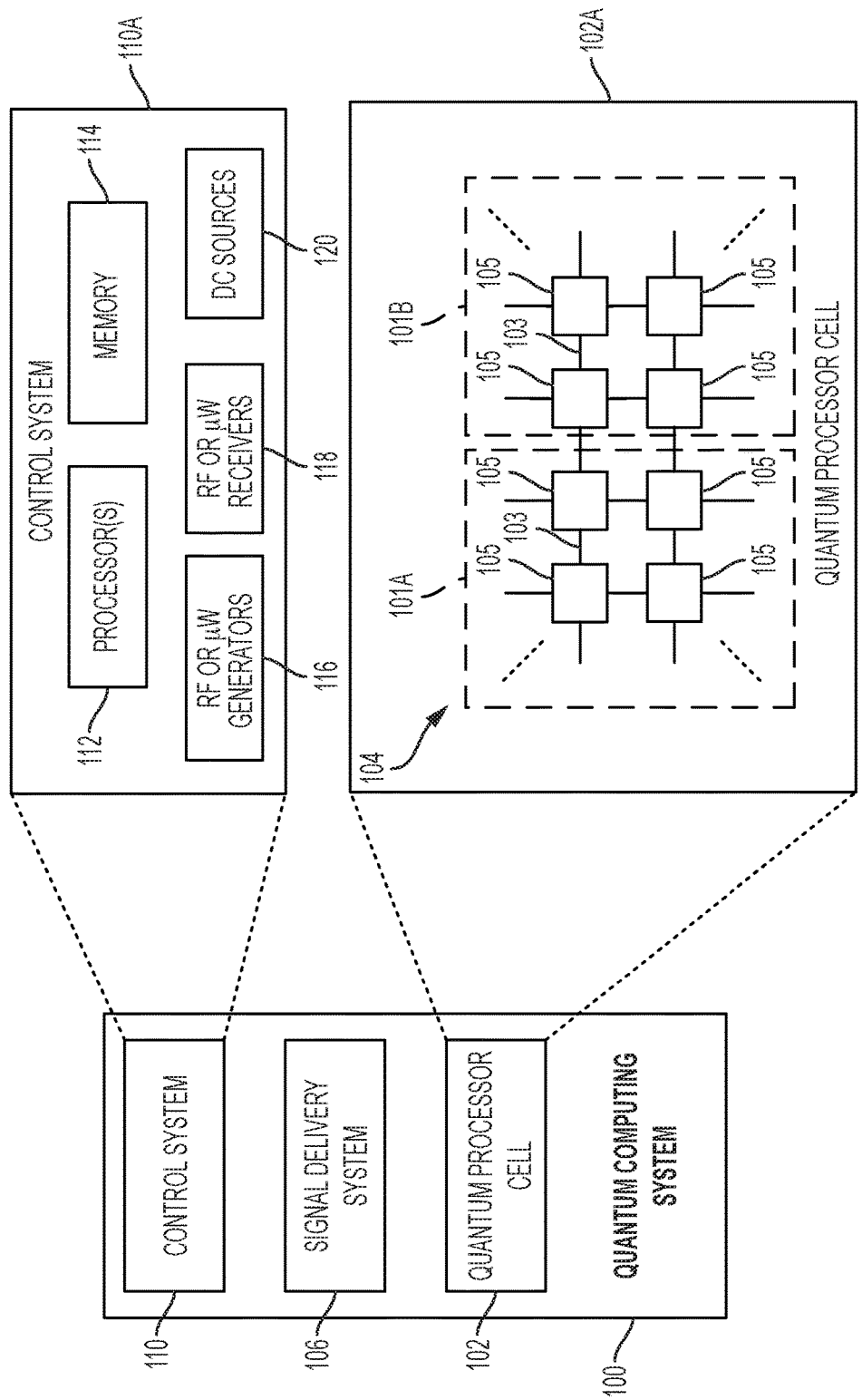
FIG. 1 is a block diagram of an example quantum computing system.

FIG. 1 is a schematic diagram of an example quantum computing system 100. The example quantum computing system 100 shown in FIG. 1 includes a control system 110, a signal delivery system 106, and a quantum processor cell 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. In some instances, quantum logic can be performed in a manner that allows large-scale entanglement within the quantum system. Control signals can manipulate the quantum states of individual qubits and the joint states of the multiple qubits. In some instances, information can be read out from the composite quantum system by measuring the quantum states of the individual qubits.

In some implementations, the quantum computing system 100 can operate using gate-based models for quantum computing. In some models, fault-tolerance can be achieved by applying a set of high-fidelity control and measurement operations to the qubits. For example, topological quantum error correction schemes can operate on a lattice of nearest-neighbor coupled qubits. In some instances, these and other types of quantum error correcting schemes can be adapted for a two- or three-dimensional lattice of nearest neighbor coupled qubits, for example, to achieve fault-tolerant quantum computation. Adjacent pairs of qubits in the lattice can be addressed, for example, with two-qubit logic operations that are capable of generating entanglement, independent of other pairs in the lattice.

In some implementations, the quantum computing system 100 is constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc.

In some instances, all or part of the quantum processor cell 102 functions as a quantum processor, a quantum memory, or another type of subsystem. In some examples, the quantum processor cell includes a quantum circuit system. The quantum circuit system may include qubit devices, resonator devices and possibly other devices that are used to store and process quantum information. In some implementations, the quantum circuit system is a superconducting quantum circuit system, in which various circuit elements are capable of operating in a superconducting state. In some implementations, the quantum circuit system is an integrated quantum circuit (e.g., an integrated superconducting quantum circuit).

In some implementations, the example quantum processor cell 102 can process quantum information by applying control signals to the qubit devices or to the coupler devices housed in the quantum processor cell 102. The control signals can be configured to encode information in the qubit devices, to process the information by performing quantum logic gates or other types of operations, or to extract information from the qubit devices. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a quantum error correction procedure, a quantum state distillation procedure, or a combination of these and other types of operations.

FIG. 1 shows an example quantum processor cell 102A that includes a superconducting quantum circuit system 104. The example superconducting quantum circuit system 104 includes circuit devices 105 arranged in a two-dimensional device array. Eight circuit devices are shown in FIG. 1. In some examples, some of the circuit devices 105 are qubit devices that each store a single qubit of information, and the qubits can collectively represent the computational state of a quantum processor. In some cases, the superconducting quantum circuit system 104 may include resonator devices coupled to the respective qubit devices, for instance, where each qubit device includes a superconducting quantum interference device (SQUID) loop and is capacitively coupled to a neighboring resonator device. The readout devices may be configured to generate readout signals that indicate the computational state of the quantum processor or quantum memory. In some examples, some of the circuit devices 105 are coupler devices that selectively operate on individual qubits or pairs of qubits. For example, the coupler devices may produce entanglement or other multi-qubit states over two or more qubits. The superconducting quantum circuit system 104 may include additional devices (e.g., additional qubit devices, coupler devices and other types of devices).

The example quantum circuit system 104 also includes connections 103 between neighboring pairs of the circuit devices 105. The connections 103 can provide electromagnetic communication between the connected circuit devices. In some cases, the connections 103 are implemented as capacitive or conductive connections. For instance, the connections 103 may include metal traces, capacitors and other components. The superconducting circuit devices 105 may be operated by microwave signals delivered in the quantum circuit system 104, for example, from the control system 110. Signals may be exchanged among the circuit devices 105 through the connections 103 or other signal pathways in the quantum circuit system 104.

The circuit devices 105 in the quantum circuit system 104 may be arranged in one or more regular or irregular arrays. For instance, qubit devices may be arranged in a rectilinear (e.g., rectangular or square) array that extends in two spatial dimensions (in the plane of the page), where each qubit device has four nearest-neighbor qubit devices. Qubit devices can be arranged in another type of regular or irregular array (e.g., a hexagonal array). In some instances, the array of circuit devices 204 also extends in a third spatial dimension (in/out of the page), for example, to form a cubic array or another type of regular or irregular three-dimensional array.

The example quantum processor cell 102A includes multiple domains. In FIG. 1, a first domain 101A and a second domain 101B are shown. The quantum processor cell may include additional domains or different types of domains. Each domain includes a subset of the circuit devices 105. For instance, the first domain 101A may include a first subset of qubit devices, a first subset of coupler devices, and a first subset of readout devices, while the second domain 101A may include a second subset of qubit devices, a second subset of coupler devices, and a second subset of readout devices. Each subset may include, for example, two, five, ten or more such devices. The domains may be defined by hardware, by control logic, by connections, by software or otherwise.

In the example shown in FIG. 1, the signal delivery system 106 provides communication between the control system 110 and the quantum processor cell 102. For example, the signal delivery system 106 can receive control signals from the control system 110 and deliver the control signals to the quantum processor cell 102. In some instances, the signal delivery system 106 performs preprocessing, signal conditioning, or other operations to the control signals before delivering them to the quantum processor cell 102.

In some instances, the signal delivery system 106 receives qubit readout signals from the quantum processor cell and delivers the qubit readout signals to the control system 110. In some instances, the signal delivery system 106 performs preprocessing, signal conditioning or other operations on the readout signals before delivering them to the control system 110. In some implementations, the signal delivery system 106 includes include input and output processing hardware, input and output connections, and other components. The input and processing hardware may include, for example, filters, attenuators, directional couplers, multiplexers, diplexers, bias components, signal channels, isolators, amplifiers, power dividers and other types of components.

In some implementations, the signal delivery system 106 and the quantum processor cell 102 are maintained in a controlled QPC environment. The QPC environment can be provided, for example, by shielding equipment, cryogenic equipment, and other types of environmental control systems. In some examples, the components in the QPC environment operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc. The levels and types of noise that are tolerated or controlled in the QPC environment can vary, for example, based on the features and operational requirements of the quantum processor cell 102 and the signal delivery system 106.

In the example quantum processor unit 100 shown in FIG. 1, the control system 110 controls operation of the quantum processor cell 102. The example control system 110 may include data processors, signal generators, interface components and other types of systems or subsystems. In some cases, the control system 110 includes one or more classical computers or classical computing components.

FIG. 1 shows an example control system 110A that includes one or more processors 112, memory 114, radio frequency (RF) or microwave (μW) generators 116, radio frequency (RF) or microwave (μW) receivers 118 and DC sources 120. A control system may include additional or different features and components. In some examples, components of the control system 110A operate in a room temperature regime, an intermediate temperature regime, or both. For example, the control system 110A can be configured to operate at much higher temperatures and be subject to much higher levels of noise than are present in the QPC environment.

In some implementations, the control system 110 includes a classical computing cluster, servers, databases, networks, or other types of classical computing equipment. For example, the memory 114 can include, for example, a random access memory (RAM), a storage device (e.g., a read-only memory (ROM) or others), a hard disk, or another type of storage medium. The memory 114 can include various forms of memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processors 112 may include one or more single- or multi-core microprocessors, one or more FPGAs or ASICs, one or more other types of data processing apparatus. The processors 112 can generate control information, for example, based on a quantum program (e.g., a quantum logic circuit, a quantum simulation, a quantum algorithm, etc.) to be performed by the quantum computing system 100 or based on other types of information.

In the example shown, the radio frequency (RF) or microwave (μW) generators 116 and the DC sources 120 can each generate control signals based on control information provided by the processors 112. The control signals can be delivered to the quantum processor cell 102 by the signal delivery system 106, for example, and interact with the circuit devices 105. In the example shown, the radio frequency (RF) or microwave (μW) receivers 118 can receive and process signals from the quantum processor cell 102. For example, receivers 118 can include a digitizer, a microwave source, and other types of signal processing components. The receivers 118 can process (e.g., digitize, or otherwise process) the signals from the quantum processor cell 102 and provide the processed information to the processors 112. The processors 112 can extract data, for example, to identify the quantum states of qubits in the quantum processor cell 102 or for other purposes.

The control system 110A may include multiple domain control subsystems. Each domain control subsystem may include a dedicated processor 112, memory 114, generator 116, receiver 118, DC source 120 and other resources. In some cases, resources are shared by multiple domain control subsystems. Each domain control subsystem in the control system 110A can control an associated domain in the quantum processor cell 102. For instance, a first domain control subsystem controls the first domain 101A and a second domain control subsystem controls the second domain 101B.

Each domain control subsystem in the example control system 110A can communicate with the devices in the associated domain in the quantum processor cell 102A. For instance, a generator 116 and DC source 120 in the first domain control subsystem can send signals to the subset of the circuit devices 105 in the first domain 101A, and a receiver 118 in the first domain control subsystem can receive signals from the subset of the circuit devices 105 in the first domain 101A; likewise, a generator 116 and DC source 120 in the second domain control subsystem can send signals to the subset of the circuit devices 105 in the second domain 101B, and a receiver 118 in the second domain control subsystem can receive signals from the subset of the circuit devices 105 in the second domain 101B.

In some instances, the control system 110 generates classical signals, including electrical waveforms or laser fields, which interact with devices in the quantum processor cell 102 to operate the quantum computing system 100; and the control system 110 may also receive classical signals back from the devices. To ensure that the classical signals are precisely tuned to the relevant device to give the desired device behavior and system operation, the control system 110 can be calibrated to the device.

In some instances, the control system 110 implements a calibration process that performs measurements on a quantum computing device and interprets those measurements to extract control parameters and device characteristics. The device characteristics can be physical attributes of the device, for example, the resonance frequency between the two lowest energy levels of a qubit. Device characteristics can be used to describe the performance of the device, for example, with respect to design goals. Control parameters can be parameters of the control system 110 that are calibrated to the device, for example, the optimal power setting for applying a read-out pulse. Correct determination of control parameters can be important, for example, to enable operation of the quantum computing system 100.

In some aspects of operation, domains of the quantum computing system 100 can be identified by operation of the control system 110. The domains can include respective domain control subsystems and respective subsets of quantum circuit devices 105 in a quantum processor 112 of the quantum computing system 100. In some instances, a first set of measurements can be obtained from a first domain 101A. The first set of measurements can be stored in a memory 114 of the control system 110. Device characteristics of the quantum circuit devices 105 of the first domain 101A can be determined by operation of the control system 110 based on the first set of measurements. The device characteristics can be stored in a memory 114 of the control system 110. The control system 110 can then determine (i.e., decide or make a determination) to obtain a second set of measurements from the first domain 101A based on the device characteristics. The determination to obtain a second set of measurements can be made automatically, for example, based on the device characteristics (and possibly other data) meeting a predefined criterion or set of criteria. For instance, the "example success criteria" described below for various experiments and measurements may be used as criteria for determining to obtain the second set of measurements. The second set of measurements can be obtained from the first domain 101A. The second set of measurements can be stored in the memory 114 of the control system 110. Quantum logic control parameters for the subset of quantum circuit devices 105 of the first domain 101A can be determined by operation of the control system 110A, based on the second set of measurements. The quantum logic control parameters can be stored in a database (e.g., a database defined in the memory 114) of the control system 110A for use in operating the first domain. An example of such a database is shown and described in connection with FIG. 4, described below. The control system 110 may perform the same process or a similar process for the other domain 101B (e.g., in parallel or otherwise).

In some aspects of operation, the domains 101A, 101B can be defined in part by hardware, control logic, physical connections, or software in the quantum computing system 100. The quantum circuit devices 105 of the first domain can include qubit devices and readout devices. The control system 110 can include a controller (where the controller includes a cache), signal conversion circuitry, a filter, and an amplifier, as further shown and described in connection with FIG. 4. The control system 110 can include an embedded operating system (OS) configured to communicate with the database and the controller, as further shown and described in connection with FIG. 4. The device characteristics can include resonance frequencies and coherence times for qubit devices in the first domain. The quantum logic control parameters can include read-out pulse parameters or quantum logic gate pulse parameters for qubit devices in the first domain. For instance, the quantum logic control parameters may include the duration, power, frequency, or other parameters of a π pulse, a π/2 pulse, a two-qubit gate pulse, a readout pulse, etc. The first set of measurements or the second set of measurements can be repeated based on a success or a failure of a calibration of the first domain of the quantum computing system 100, for example, as discussed below with respect to FIG. 2.

Figure 2:
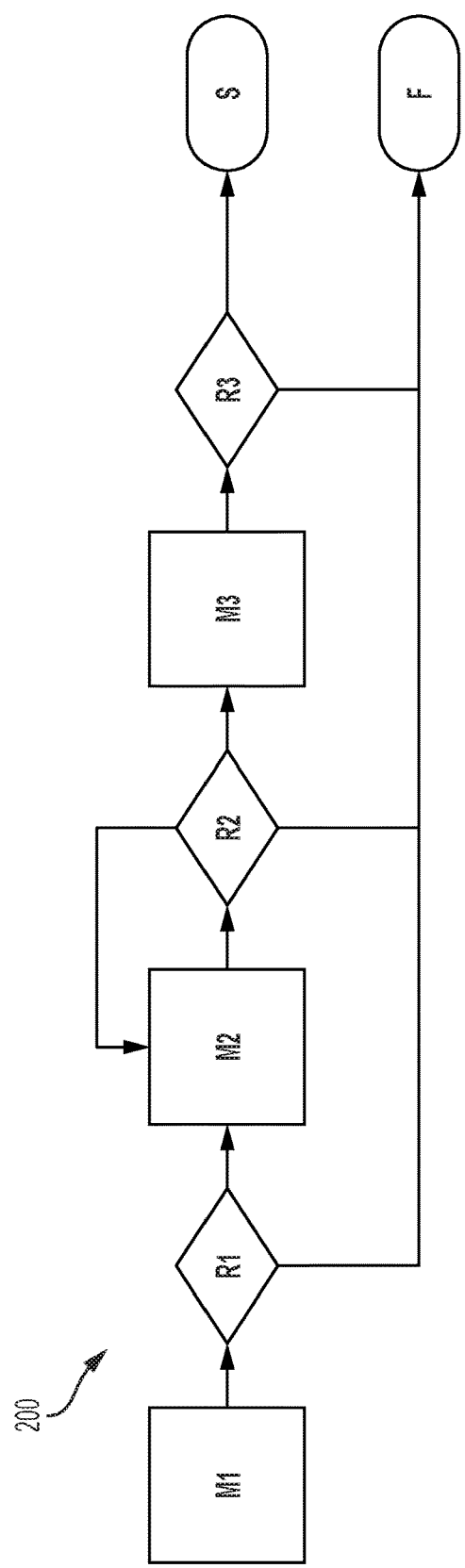
FIG. 2 is a block diagram of an example calibration process.

FIG. 2 is a block diagram of an example calibration process 200. The example calibration process 200 can determine device characteristics and control parameters in a quantum computer system. The calibration process 200 will, in general, depend on the design and architecture of the quantum computing system used. The example calibration process 200 includes a set of logical blocks, each representing an experimental measurement (e.g. M1-M3), and a procedure to determine the result of the measurement (e.g. R1-R3). The procedure specifies the measurements themselves, and a map from each measurement result to: (a) a new measurement (R1, R2); (b) a repetition of the same measurement, possibly with new parameters (e.g. R2); or (c) a terminal state, indicating success (R3) or failure of the procedure (R1-R3). On reaching the terminal state, the computer may notify one or more external systems or recipients (e.g., via email or instant message (e.g. Slack, etc.)).

As shown in FIG. 2, the first experimental measurement M1 is obtained, and the first measurement result R1 (e.g., a device characteristic of a quantum circuit device) can be determined from the first experimental measurement M1. Based on the first measurement result R1, it can be determined to obtain a second experimental measurement M2. For instance, if a device characteristic (e.g., coherence time, qubit frequency, anharmonicity, etc.) determined from the first experimental measurement M1 meets a predefined criterion, then the process 200 may automatically determine to obtain the second experimental measurement M2; but if the device characteristic determined from the first experimental measurement M1 does not satisfy the quality criterion, the process 200 may automatically determine to move to a terminal state indicating failure F. The second experimental measurement M2 can then be obtained, and the second measurement result R2 (e.g., quantum logic control parameters for a quantum circuit device) can be determined from the second experimental measurement M2. For instance, if a quantum logic parameter determined from the second experimental measurement M2 meets a predefined criterion, then the process 200 may automatically determine to obtain the third experimental measurement M3; but otherwise, the process 200 may automatically determine to move to a terminal state indicating failure F, or to repeat the second experimental measurement M2 (e.g., using different parameters, etc.). The process 200 can continue in a similar, automated manner for one or more further experimental measurements (e.g., the third experimental measurement M3) and one or more further measurement result determinations (e.g., measurement result R3) until reaching a state representing success S or failure F. The predefined criteria used at R1, R2, R3 can include the "example success criteria" described below or other types of criteria.

The example calibration process 200 is modular in that it may include several sub-procedures. A modular sub-procedure may be reused to implement a characterization or calibration procedure for different kinds of devices that share a common component. When the sub-procedure terminates it returns control to the main procedure which uses the result to determine what to do next. The modular sub-procedures may also be used independently of the full experimental procedure. For example, a certain set of control parameters optimal values may drift over time and a sub-procedure to re-calibrate just those parameters that have drifted need not require a full run of the experimental procedure. This enables on-line calibration, where the operation of the device does not need to be completely paused in order to recalibrate.

In some cases, there are constraints on measurement ordering, as some measurements may only give useful results if particular control parameters or device characteristics are known to sufficient precision. The experimental procedure can take this into account, for instance, by only allowing such measurements downstream from the measurement(s) that determine the parameters or characteristics required. Each measurement can determine one or more device characteristics or control parameters (possibly to finite precision). At the end of each measurement, the measured characteristics or parameters can be committed to the memory. Thus, as the procedure progresses and eventually terminates, a store of the characteristics and parameters is constructed. In some implementations, all the characteristics and parameters of interest can be measured and stored.

In some instances, to determine the result of a measurement, the logical measurement block includes a procedure that takes as an input the measurement data and outputs: (a) extracted values for the characteristics and parameters, and (b) a member of the discrete set of outputs used to select the next measurement. In (b), the possibility that the measurement failed to produce meaningful results can be accounted for. If the problem is recoverable, like an insufficient scan range, or additional averaging is necessary, the measurement may be repeated with new parameters. If the error is not recoverable, the experimental procedure may exit to a failure state. Techniques for determining whether the measurement has succeeded or failed may be statistical in nature, based on some goodness of fit metric for fitted data (e.g. reduced residual chi-squared statistic, Akaike Information Criterion, Bayesian Information Criterion, etc.), based on machine learning, or some combination thereof.

Figure 3:
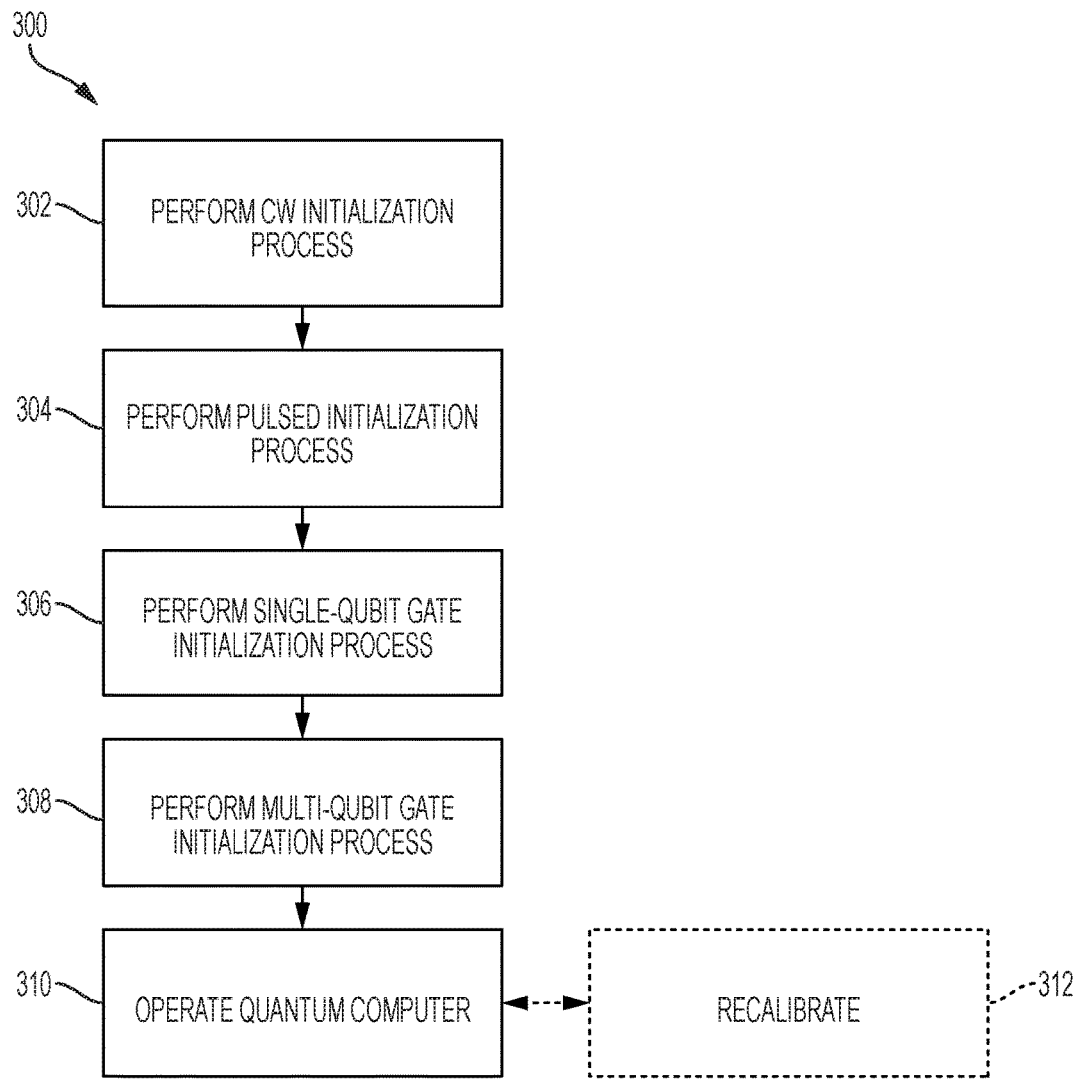
FIG. 3 is a block diagram of an example calibration process.

FIG. 3 is a block diagram of an example calibration process 300. The example calibration process can be performed in a quantum computing system, for example, to characterize and tune up components of the quantum computing system. For instance, the example calibration process 300 may be used to calibrate one or more domains, subsystems or devices in the example quantum computing system 100 shown in FIG. 1. In some cases, the calibration process 300 is controlled by a control system of the quantum computing system. The process 300 may include additional or different operations, and the operations may be performed in the order shown or in another order. In some cases, multiple operations are combined, performed in parallel or divided into additional operations.

In some cases, multiple instances of the process 300 are applied in parallel in the respective domains of a quantum computing system. In some cases, portions of the process 300 may be iterated periodically during operation of the quantum computer system.

At 302, a continuous wave (CW) initialization process is performed. The CW initialization process may include one or more of the operations described in the "1. CW Bring-up" section below. In the examples described, CW measurements are performed over time scales that are significantly longer than the coherent lifetimes of the qubits. At 304, a pulsed initialization process is performed. The pulsed initialization process may include one or more of the operations described in the "2. Pulse Bring-up" section below. In the examples described, pulsed measurements are performed over time scales that are shorter than the coherent lifetimes of the qubits.

At 306, a single-qubit gate initialization process is performed. The single-qubit gate initialization process may include one or more of the operations described in the "3. Gate Tune-up" section below. At 308, a multi-qubit gate initialization process is performed. The multi-qubit gate initialization process may include one or more of the operations described in the "5. Multi-qubit Gate Tune-Up" section below.

At 310, the quantum computer system is operated. For example, the quantum computer system may execute quantum logic circuits or other types of quantum algorithms. At 312, one or more of the domains, subsystems or devices in the quantum computing system is recalibrated. The recalibration may include one or more iterations of the operations (302, 304, 306, 308) applied to the whole quantum computing system or to a specific domain, subsystem or device in the quantum computing system.

Figure 4:
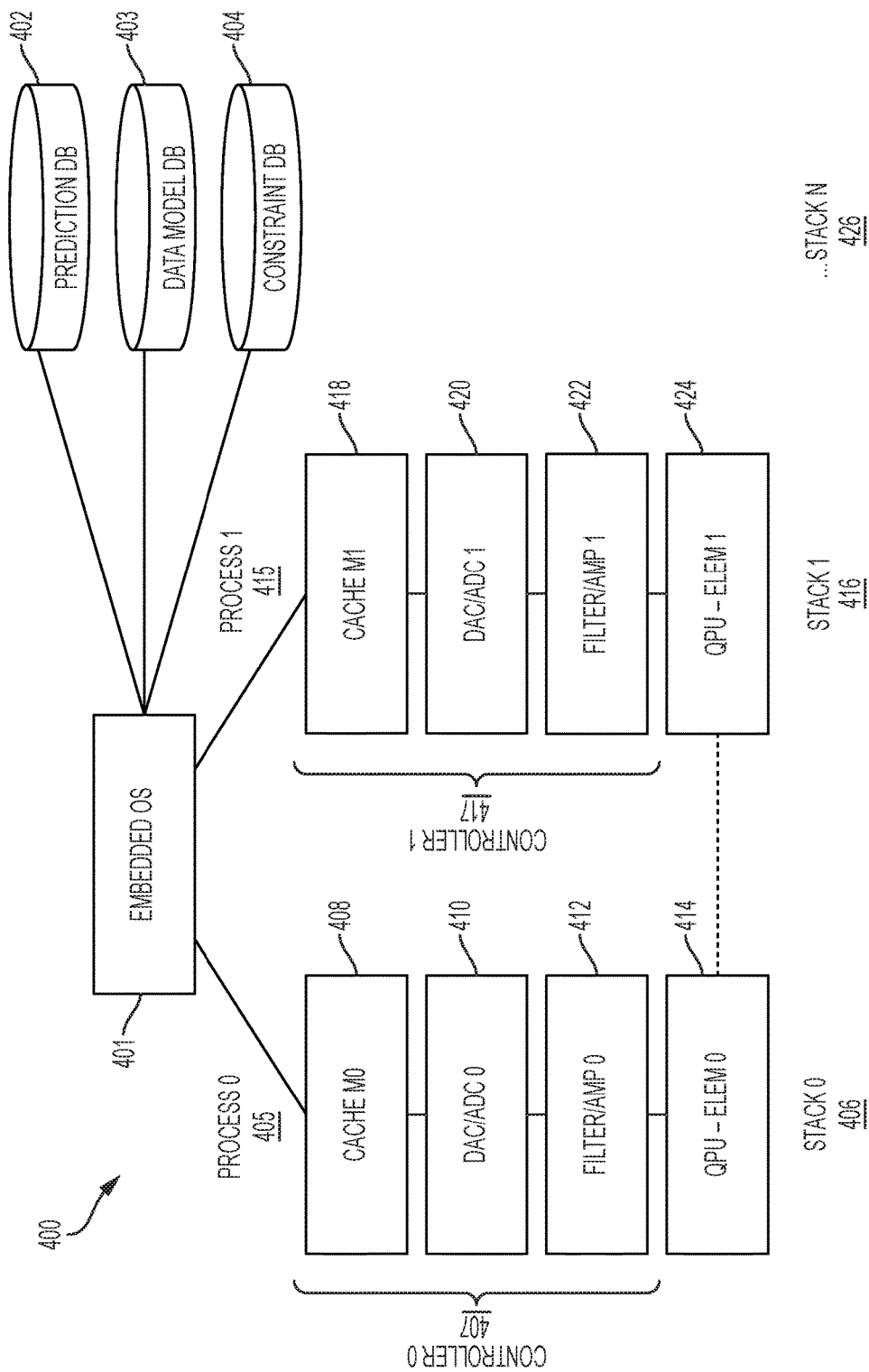
FIG. 4 is block diagram of an example quantum computing system.

FIG. 4 is a block diagram of an example quantum computing system 400. In some cases, the features and components shown in FIG. 4 may be used to implement aspects of the example quantum computing system 100 shown in FIG. 1. In various implementations, an embedded operating system (OS) 401 serves as a central controller of the system. The embedded operating system 401 may be a real-time operating system embedded on a chip, for example, a field-programmable gate array (FPGA). The embedded operating system 401 may be a kernel (for example, a Linux kernel) embedded on a chip (for example, the FPGA). The embedded operating system 401 may run on a physical CPU with a low-latency connection to the rest of the hardware system of quantum computing system.

In some implementations, the embedded operating system 401 can communicate with various databases, the databases comprising larger-latency memory caches. The databases can include a predictions database 402, a data model database 403, and a constraints database 404. In another implementation, while three separate databases are shown in diagram 400, the databases may be consolidated into one database. The databases can contain information pertaining to quantum system and device predictions (for example, via the predictions database 402), the models for extracting parameters from the data (for example, via the data model database 403), and the constraints for determining success criteria for the calibration steps (for example, via the constraints database 404). The data associated with the databases may be stored, for instance, on a centralized server. The centralized server can be available for asynchronous updates. The data may also be stored on-board, for example, on an FPGA controller. This can allow for low-latency access which may be needed for a given operation of the quantum system.

In some implementations, the operating system can execute a multitude of processes to calibrate the QPU system, as described variously herein. The processes may be executed in parallel. Each process (for example, process 0 405, process 1 415, and process N, not shown) may utilize a stack for operation. Examples of such stacks shown in FIG. 4 include stack 0 406, stack 1 416, or stack N 426, where N is a positive integer. In some implementations, the stacks, for example, stack 0 406 and stack 1 416, can include electronics, for example, the electronics labeled as controller 0 407 and controller 1 217 in FIG. 4. Controller 0 407 can include a cache M0 408, a digital-to-analog converter (DAC), and an analog-to-digital converter (ADC) shown as DAC/ADC 0 410 in FIG. 4, a signal chain comprising a filter and an amplifier shown as FILTER/AMP 0 412 in FIG. 4, and relevant QPU elements, shown as QPU ELEM 0 414 in FIG. 4. Similarly, the controller 1 417 can include a cache M1 418, a DAC and an ADC shown as DAC/ADC 1 420, a signal chain comprising a filter and an amplifier shown as FILTER/AMP 1 422 in FIG. 4, and relevant QPU elements, shown as QPU ELEM 1 424 in FIG. 4. Similar components can be defined for additional controllers N (not shown), which can be part of a stack N 426. In some implementations, the QPU elements (for example, QPU ELEM 0 414 and QPU ELEM 1 424) may include couplings to other parts of the QPU which may be relevant to the execution of particular operations.

In the following text, a detailed list of example experiments is described. Each experiment provides an example of the equipment and operations to perform all or part of an initialization or calibration process. A central server or other processor can dispatch the processes to sub-processing units or domain control subsystems that operate a domain in a quantum processor cell. In each experiment, the qubits and their measured properties, whose design parameters have been journaled, may be compared and evaluated. The step-by-step process coupled with the computing architecture may allow for the tune-up of large scale superconducting quantum circuit systems.

1. Continuous wave (CW) bring-up
   a. CW cavity spectroscopy
      i. Instruments can include RF signal generator with amplitude and frequency control, RF signal receiver.
      ii. Single tone continuous-wave measurement
         1. A two-dimensional power and frequency scan is performed on the resonator drive line. RF reflected off the resonator is measured. Both the power and the phase of the reflected field are measured at each point. Reflection amplitude dips and resonant phase rolls are noted as likely resonators. Cross-correlation with designed resonator frequency allows identification of likely resonators.
         2. Nonlinear response from the resonator, known as the Lamb shift, denotes the presence of a nonlinear system interacting with the resonator. Cavity responses taken at a higher power above the nonlinear response are referred to as the high-power branch. Cavity responses taken at a lower power below the nonlinear response are referred to as the low-power branch. The measurement system decides whether a successful qubit is addressable via this drive line with the existence of this lamb shift.
      iii. Example success criteria can include: (A) Fitted resonator Q and fitted resonant frequency are compared to design Q and frequency, a conformance window is specified to denote success. (B) Measured Lamb shift versus predicted Lamb shift is also compared to design intent, a conformance window is specified to denote success. Criteria (A) and (B) may both need to be satisfied.
   b. CW qubit spectroscopy
      i. Instruments can include: 2×RF signal generator with amplitude and frequency control, and a RF signal receiver
      ii. Two-tone continuous wave measurement
         1. A single tone on the low power branch of a resonator-qubit system is reflected off the resonator. The reflected signal is constantly monitored for both its reflected power and its reflected phase. A second tone is swept in both frequency and power along a qubit drive line. The response of the first tone reflecting off the cavity will exhibit changes in its reflected behavior. These changes will occur when systems coupled to the cavity change the cavity dressed state as they are resonantly driven. Cross correlating spectrum of the designed qubit with observed transition frequencies and transition strengths for constant drive power, the system assigns energy level transition frequencies of single or multi-photon transitions in the qubit.

iii. CW Qubit T1 and T2 estimation
1. Automatic operation: After identification of the single photon transition from the 0 qubit state to the 1 qubit state, a variation of the above experiment is performed. Iteratively lowering the qubit drive power and the resonator probe power, the Lorentzian response of the qubit is probed at lower and lower powers. The system fits Lorentzian to the qubit until the signal to noise reaches a specific cutoff. The lowest achievable linewidth of the qubit acts as an indication of the incoherent linewidth of the qubit, indicating the approximate T1 relaxation time. The measurement system can determine to mark the qubit as viable for computation if the T1 is larger than a preset number.
2. Semi-Automatic operation: After identification of the single photon transition from the 0 qubit state to the 1 qubit state, a variation of the above experiment is performed. An algorithm iteratively suggests lowering the qubit drive power and the resonator probe power. Each suggestion can be easily manipulated by the operator, or the operator can accept the algorithm's suggested experimental parameters. A measurement is run with the new experimental parameters. The system fits Lorentzian to the qubit until the signal to noise reaches a specific cutoff. The lowest achievable linewidth of the qubit acts as an indication of the incoherent linewidth of the qubit, indicating the approximate T1 relaxation time. The measurement system can determine to mark the qubit as viable for computation if the T1 is larger than a preset number.

iv. Example success criteria can include: (A) Fitted transition frequencies for the 0 to 1 energy splitting and the 0-2 energy splitting are compared to design intent within a conformance window. (B) Qubit linewidth is compared to a minimum achievable linewidth metric, achieving a linewidth less than the minimum passable linewidth denotes a success. Criteria (A) and (B) may both need to be satisfied.

c. CW Josephson parametric amplifier (JPA) single-tone spectroscopy
i. Instruments can include: RF signal generator with amplitude and frequency control, RF signal receiver, controllable constant current source to set magnetic flux through SQUID loop.
ii. Single tone continuous wave measurement
1. The Josephson parametric amplifier circuit is a single port device constructed of a low Q resonator with a tunable SQUID. RF is sent into the JPA with the use of a microwave circulator. A tunable resonant mode with a flux dependent resonant frequency is observed in a 2D plot of applied flux versus tone frequency. The reflected RF phase (and to a lesser extent the amplitude) provides a means of distinguishing the resonant frequency of the tunable mode. Due to the asymmetry in the Josephson Junctions a large modulation of frequencies should be accessible, observing a repetitive pattern indicates a well behaved JPA.
iii. Example success criteria can include: (A) A successful fit, with low chi squared, to the periodic modulation of the resonant frequency denotes success.

d. CW JPA gain optimization
i. Instruments can include: a 2×RF signal generator with amplitude and frequency control, RF signal receiver, tunable constant current source to set magnetic flux through SQUID loop.
ii. Two-tone continuous wave measurement
1. Both a pump RF tone and a signal tone are sent into the JPA via a microwave circulator. Using a directed search algorithm, the pump tone's frequency and power are scanned by the automated search algorithm along with the applied flux to the JPA. The signal tone's frequency is chosen to be the frequency we are interested in amplifying. The signal tone is measured both with and without the pump tone present multiple times. Amplification and noise in the repeated measurements are measured. The amplification divided by the noise in the amplification are sent to the directed search algorithm to maximize their ratio for a given pump frequency, power and applied flux.
iii. Example Success Criteria can include: (A) The amount of gain achieved is compared to the design specification for minimum gain, success denotes measuring more gain than the minimum required.

2. Pulse bring-up
a. Cavity spectroscopy
i. Instruments can include: pulsed RF signal generator with amplitude and frequency control, Pulsed RF signal receiver
ii. 2D cavity spectroscopy
1. A measurement is performed with pulses longer than the cavity ring-up time. Varying the power of the RF pulse and the frequency of the pulse a two dimensional scan is taken. Fitting the reflected power or frequency response of the demodulated reflected pulses a lamb shift measurement is observed. Pattern recognition algorithms discover the low power branch and identify possible pulse parameters to save as a candidate readout point, including the frequency and power of the pulse for an on-resonant low power interrogation of the readout resonator.
iii. Example success criteria can include: (A) Successful 1D fits of cavity response versus frequency denote success. (B) Producing a candidate readout point also denotes success. Criteria (A) and (B) may both need to be satisfied.

b. Rabi spectroscopy of the qubit
i. Instruments can include: 2× pulsed RF signal generator with amplitude and frequency control, and a pulsed RF signal receiver.
ii. Pulsed measurement involving a qubit drive pulse and a cavity interrogation
1. Using the frequency discovered by 1.b.iii. CW Qubit T1/T2 estimation, qubit pulses much shorter than the coherent lifetime of the qubit are sent at varying frequencies to the qubit drive line. Subsequent interrogation of the cavity is recorded for each pulse that is sent. The response of the cavity resonator will trace out a coherent Rabi line shape of the qubit.
2. Or Using the frequency discovered by 1.b.iii. CW Qubit T1/T2 estimation, qubit pulses much longer than the coherent lifetime of the qubit are sent to the qubit drive line. Subsequent interrogation of the cavity is recorded for each pulse that is sent. The response of the cavity resonator will trace out an incoherent Lorentzian at the qubit frequency.
iii. Example success criteria can include: (A) Successful fit to qubit resonance, either a driven Rabi lineshape (1) or a Lorentzian lineshape (2) can denote success.
c. Power Rabi
i. Instruments can include 2× pulsed RF signal generator with amplitude and frequency control, and pulsed RF signal receiver
ii. Pulsed measurement involving a qubit drive pulse and a cavity interrogation
1. Given a successful frequency measurement and response from measurement 2.b. A fixed-time interval pulse is sent to the qubit drive line. Followed by a subsequent cavity interrogation. The amount of RF power is varied from 0 to a maximum achievable from the RF instrumentation. At each RF power the cavity's response will mirror the state of the qubit. Oscillations are fit to a simple power-broadened Rabi flopping model, where a sinusoid with qubit-drive, amplitude-dependent frequency is observed.
a. Advanced readout calibration is also accomplished by defining the axis in I/Q space with the largest variance from the measurement. This defines the optimal quadrature. All subsequent measurements can be projected onto the saved optimal quadrature.
iii. Success criteria can include: (A) Successful fit to a power Rabi curve denotes success. (B) Amplitude to Rabi Frequency conversion is compared to design intent, agreement to conformance window denotes success. Criteria (A) and (B) may both need to be satisfied.
d. Ramsey spectroscopy
i. Instruments can include: 2× pulsed RF signal generator with amplitude and frequency control, and pulsed RF signal receiver
ii. Pulsed measurement involving two separated qubit drive pulses and a cavity interrogation
1. A π/2 pulse is sent down the qubit drive line, after a variable duration of no RF pulse another π/2 pulse is sent down the qubit drive line, followed by a cavity interrogation pulse. By varying the delay time and plotting the cavity response as a function of delay time a Ramsey spectrum can be observed.
a. Additionally, the second π pulse can be given a phase offset. This phase offset mimics the local oscillator of the qubit drive as having been detuned during the variable duration wait time. Subsequently the Ramsey spectrum will have a clear frequency offset which allows for easier data fitting between the timescales of the Ramsey oscillation and the decay of the coherence of the qubit.
b. Both measurements allow for carefully fitting the qubit resonance.
iii. Example Success Criteria can include: (A) Successful fit to a Ramsey curve denotes success. (B) Detuning fit parameter must not exceed expected detuning parameter beyond a conformance window. Criteria (A) and (B) may both need to be satisfied.
e. Power Rabi
i. Measurement 2.c.i. Is repeated with the newer more accurate qubit frequency/detuning.
ii. Example success criteria can include: (A) Successful fit to a Power Rabi curve denotes success. (B) Amplitude to Rabi Frequency conversion is compared to design intent, agreement to conformance window denotes success. Criteria (A) and (B) may both need to be satisfied.
f. T1
i. Instruments can include: 2× Pulsed RF signal generator with amplitude and frequency control, and pulsed RF signal receiver.
ii. Pulsed measurement involving one qubit drive pulse, a variable delay, and a cavity interrogation.
1. Using the pulse parameters from 2.d. and 2.e. The state of the qubit is inverted via a π pulse. A variable delay where no RF is performed on the qubit of interest. After each delay a cavity interrogation tone is sent to probe the cavity's response and map the state of the qubit. Repeating the experiment many times the relaxation time to the qubit ground state is measured.
a. Delay times are made from logarithmically spaced samples to probe very large ranges of possible delay times.
iii. Example Success Criteria can include: (A) successful fit to a decay curve denotes success. (B) The decay constant must be sampled at a sufficiently long timescale, measurements are repeated increasing the sampling time in a fixed manner until the sampling time and the decay constant meet an explicit ratio to within a conformance window. Criteria (A) and (B) may both need to be satisfied.
g. T2 taken with Ramsey Spectroscopy
i. Instruments can include: 2× Pulsed RF signal generator with amplitude, frequency, and phase control, and a pulsed RF signal receiver.
ii. Pulsed measurement involving two separated qubit drive pulses and a cavity interrogation
1. A π/2 pulse is sent down the qubit drive line, after a variable duration of no RF pulse another π/2 pulse is sent down the qubit drive line, followed by a cavity interrogation pulse. By varying the delay time and plotting the cavity response as a function of delay time a Ramsey spectrum can be observed.
a. Additionally, the second π pulse can be given a phase offset. This phase offset mimics the local oscillator of the qubit drive as having been detuned during the variable duration wait time. Subsequently the Ramsey spectrum will have a clear frequency offset which allows for easier data fitting between the timescales of the Ramsey oscillation and the decay of the coherence of the qubit. Performing the measurement such that the frequency offset oscillations and the T2* act on sufficiently separated (>5×) timescales allows for good fitting of the data and accurate extraction of the T2* time.

iii. Example success criteria can include: (A) Successful fit to a Ramsey curve denotes success. (B) The Ramsey curve decay constant must be sampled at a sufficiently long timescale, measurements are repeated increasing the sampling time in a fixed manner until the sampling time and the decay constant meet an explicit ratio to within a conformance window. Criteria (A) and (B) may both need to be satisfied.

3. Gate tune-up
  a. Readout optimization
    i. Instruments can include a 2× Pulsed RF signal generator with amplitude and frequency control, and a pulsed RF signal receiver.
    ii. Pulsed measurement to optimize the readout fidelity
      1. For subsequent measurements cavity interrogation parameters need to be more precisely set. Repeatedly inverting the qubit population via a π pulse on the qubit drive line followed by a cavity interrogation supplies a histogram of cavity responses. Performing the same measurement without the qubit inversion provides cavity responses for the qubit in the ground state. Training a binary classifier on the separation of these two data sets with normal ROC curve metrics provides objective functions that can be optimized by changing the cavity interrogation parameters. Feeding these objectives into an automatic system that repeats the measurements to maximize the achievable assignment fidelity by optimizing the cavity interrogation time, frequency, and power allows the system to tune itself to optimal readout conditions.
        a. Optimal quadrature settings are updated with the further refined cavity interrogation parameters.
    iii. Example Success Criteria can include: (A) Measured readout fidelity may need to meet or exceed design specification.
  b. AC Stark coefficient measurement
    i. Instruments can include: 2× pulsed RF signal generator with amplitude, frequency, and phase control, pulsed RF signal receiver
    ii. Pulsed measurement to optimize drive detuning
      1. Qubit driving fields are detuned from multiple different transitions. Detuned driving of these resonances causes dispersive shifts on these levels leading to a power dependent shift of the ground to first excited state of the qubit. Scanning the amplitude of a power dependent tuning coefficient repeated pulse sequences bringing the qubit partially toward its excited state and then back to the ground state are sent to the qubit along the qubit drive line followed by a cavity interrogation. For longer and longer sequences of repeated pulses the error associated with detuning can be amplified. The AC stark coefficient is found to be optimal when the qubit returns to its ground state. This value is saved, and subsequent pulses are modulated by this coefficient.
    iii. Example success criteria can include (A) Measured AC stark coefficient must conform to design window specifications. (B) Fidelity of returning to ground state may need to be greater than predefined success criteria. Criteria (A) and (B) may both need to be satisfied.
  c. π-π Amplitude tune-up
    i. Instruments can include: a 2× Pulsed RF signal generator with amplitude, frequency, and phase control, Pulsed RF signal receiver.
    ii. Pulsed measurement to optimize over and under rotation errors
      1. To optimize the effect of gates on the qubit, repeated applications of the same gate are performed on the qubit. Errors in the parameters of the gate will cause over (or under) rotation of the qubit state. By performing sequences that should nominally return the qubit to its initial state, any deviation from idealized pulses will cause there to be a different qubit state measured.
        a. The qubit is first rotated by a π/2 pulse to be in a superposition of the ground and excited state, placing the state of the qubit on or near the equator of the Bloch sphere. An even number of subsequent π/2 pulses (0, 2, 4, 6, etc.) are then sent to the qubit. For an optimal pulse this will rotate the qubit to the equator again. Subsequent cavity interrogations will reflect the state of the qubit. Any deviation of the qubit state (as measured by the cavity) from its original position on the Bloch sphere will be indicative of an under or over rotation. An optimization algorithm automatically adjusts the amplitude of the pulse to correct for over/under rotation errors by probing larger numbers of applied pulses, such that small errors are amplified.
        b. The qubit is first rotated by a π/2 pulse to be in a superposition of the ground and excited state, placing the state of the qubit on or near the equator of the Bloch sphere. Any number of subsequent π pulses (0, 1, 2, 3, etc.) are then sent to the qubit. For an optimal pulse this will rotate the qubit to the equator again. Subsequent cavity interrogations will reflect the state of the qubit. Any deviation of the qubit state (as measured by the cavity) from its original position on the Bloch sphere will be indicative of an under or over rotation. An optimization algorithm automatically adjusts the amplitude of the pulse to correct for over/under rotation errors by probing larger numbers of applied pulses, such that small errors are amplified.
    iii. Example success criteria can include: (A) A fractional deviation from the equator is calculated and an inferred over/under rotation error is calculated, this is compared to a passing criterion associated with the number of pulses performed.
  d. DRAG tune-up
    i. Instruments can include: 2× Pulsed RF signal generator with amplitude, frequency, and phase control, and Pulsed RF signal receiver.
    ii. Pulsed measurement to optimize leakage error from driving the qubit to its second excited state.
      1. So-called leakage errors occur when power-broadening of the qubit linewidth starts to show significant coherent drive to the second excited state of the qubit. Reducing this can be accomplished by applying a derivative of the pulse envelope to the opposite RF driving quadrature. The amplitude of this opposite quadrature drive signal can be scaled by a unitless coefficient. Optimally setting this coefficient to maximally reduce leakage will reduce gate infidelity. Different sequences of pulses that are especially sensitive to detuning errors when driving the qubit, like mixtures of π/2 pulses about X and π/2 pulses about Y will exhibit opposite signed errors. By playing repeated sequences of X/2 and Y/2 pulses the error can be amplified. Sending repeated X/2, Y/2 sequences along the qubit drive line followed by a cavity interrogation pulse allows us to map the position of the qubit on the Bloch sphere. Repeating the experiment but permuting the order of the π/2 pulses (to Y/2, X/2) can cause residual error to accumulate in the opposite direction along the Bloch sphere. The difference between these two signals is fed into an optimizer that changes the DRAG amplitude coefficient. The optimizer works to minimize the difference between these two measurements and saves the DRAG amplitude coefficient such that all pulses know include the DRAG correction.
  iii. Example success criteria can include: (A) The goodness of fit for the fitted crossing of the two measurements is compared to a minimum goodness of fit. (B) The fitted DRAG coefficient must fall within a specified window to denote success. Criteria (A) and (B) may both need to be satisfied.
 e. π-π Fine-tune
  i. Instruments can include: 2× Pulsed RF signal generator with amplitude, frequency, and phase control, and a pulsed RF signal receiver.
  ii. Pulsed measurement to optimize over and under rotation errors
   1. A repetition of measurement 3.c is performed after the inclusion of DRAG.
  iii. Example success criteria can include: (A) A fractional deviation from the equator is calculated and an inferred over/under rotation error is calculated, this is compared to a passing criterion associated with the number of pulses performed.
 f. Perform randomized benchmarking
  i. Instruments can include: 2× Pulsed RF signal generator with amplitude, frequency, and phase control, and a Pulsed RF signal receiver
  ii. Pulsed measurement to verify functionality of tuned gates
   1. For a given circuit length a random quantum circuit is constructed by choosing elements from the Clifford algebra group, including the last elements which effectively invert the operation of all previous elements on the qubit. This procedure is repeated multiple times. For each random circuit the pulses are sent to the qubit followed by a cavity interrogation and the result is saved. Gate errors and state preparation and measurement errors will lead to the qubit not being measured in the ground state. This experiment is repeated for multiple random circuits and for multiple lengths of random circuits. Gate fidelity is inferred by fitting the averaged results of all these measurements by a power-law function as at low fidelities or at long times the constant application of gates will drive the qubit to the equator of the Bloch sphere.
  iii. Example success criteria can include: (A) A minimum achieved gate fidelity must be fit to denote success.
 g. Perform further benchmarking algorithms
  i. Instruments can include: 2× Pulsed RF signal generator with amplitude, frequency, and phase control, and a pulsed RF signal receiver
  ii. Perform Gate Set Tomography
   1. To verify the gate unitaries and the measurement accuracy Gate Set Tomography is performed.
  iii. Example success criteria can include: (A) A minimum achieved gate fidelity must be fit to denote success.
4. Tunable qubit bring-up (automated bring-up variation for flux-tunable qubits)
 a. Instruments can include: a 2× Pulsed RF signal generator with amplitude, frequency, and phase control, Pulsed RF signal receiver, tunable constant current source to set magnetic flux through SQUID loop.
 b. In a loop over flux bias values bring up qubit similar to (2) above:
 Before beginning a loop of bring-ups for different flux settings, follow the normal bring-up procedure (2) for a starting flux value.
 Strategy I: Terminate after 1 flux period, adjust step size to achieve fixed delta in qubit frequency.
 Strategy II: Specify a sequence of flux bias values.
 Following either strategy I or II.
  i. Set constant current source to new constant flux bias current, changing it at a controlled rate.
  ii. Choose readout settings
   1. For dispersive readout, perform measurement 2.a.i., set readout frequency to be on resonance with cavity resonance.
   2. For high-power (nonlinear) readout, use previously saved readout settings.
  iii. Perform qubit spectroscopy as specified in (2.c) and project IQ data onto most recently measured optimal readout axis.
  iv. Perform power Rabi measurement as in 2.c.
  v. Optimize readout as in (3.a) and update the readout settings (frequency, power, pulse width, or any set of parameters of the readout pulse and readout acquisition system).
  vi. Measure T1 as in 2.f.
   1. Guess the T1 value to be measured.
    a. In the first iteration of the loop this is brought in from a previous instance of (2.f) at a nearby (or the same) flux bias.
    b. For subsequent guesses, extrapolate from previous guesses.
     i. Due to noise (including non-Markovian noise) in the T1 measurements, digital filtering is employed to smooth the data.
     1. Exponentially weighted averaging to extrapolate future iterations is employed.
  vii. Measure T2* as in 2.g. (Ramsey)
   1. Guess the T2 value to be measured.
    a. We follow the same strategy as in (4.b.vi.1), for the same reasons (noise in T2* values).
  viii. Measure T2 and CPMG
   1. Pulsed measurement for extracting T2 and noise sensitivity of qubit.
    a. Performing a Ramsey T2* experiment as in 2.g but with the inclusion of π (echo) pulses the qubit's response to different numbers of echo pulses can be mapped out. Measurements are performed where the delay time is evenly divided by the number of echo pulses performed on the qubit.

c. Fit the qubit frequency versus flux bias data to a model and extract Hamiltonian parameters with uncertainties.
d. Generate the pure dephasing rate ($1/T2-1/2T1$) and the gradient of the transition frequency f0 1 and fit the data to a linear equation and extract the flux noise amplitude and the background noise level.
e. At a flux insensitive point ($f_{min}$ or $f_{max}$):
   i. Perform gate tune-up as in (3) above.
   ii. Perform benchmarking as in (3.g.) above.
5. Multi-qubit gate tune-up
   a. Instruments can include 4× Pulsed RF signal generator with amplitude, frequency, and phase control, 2× Pulsed RF signal receiver
   b. Measure qubit-qubit coupling
      i. Fixed coupling designs
         1. π-Ramsey measurement
            a. After both qubits have been individually tuned for Single qubit operation a variation on the Ramsey experiment (2.d) is performed. On one qubit, designated as qubit A, a Ramsey experiment (2.d.) is performed. Immediately preceding this measurement on the other qubit, designated as qubit B, a π pulse is sent exciting qubit B to its first excited state. A Ramsey curve is fit to qubit A's resonator response. The difference between the fitted detuning and the expected detuning is denoted as the qubit A-qubit B chi.
         2. Example success criteria can include: (A) The fitted chi is compared to the designed chi.
      ii. Tunable qubit designs
         1. For weak coupling, π-Ramsey measurement
            a. At a given constant current flux bias measurement 5.b.i.1.a is performed.
         2. For strong coupling, avoided crossing Rabi spectroscopy
            a. A tunable qubit, designated qubit A, is tuned into resonance with another qubit, designated qubit B. Similar to 2.b, a Rabi spectroscopy curve is taken. Because both qubits have hybridized one will measure two response peaks. This spectrum is fit and the splitting between the peaks is related to the qubit A-qubit B coupling.
         3. Example success criteria can include: (A) The fitted chi or qubit-qubit resonance coupling g is compared to the design intent.
   c. Implement gates
      i. Fixed coupling designs
         1. Two qubit Ramsey oscillations
            a. For fixed frequency designs the inherent ZZ coupling allows a phase accumulation to occur which when pre-pended and post pended with single qubit gates creates a CNOT-like gate. By performing the single qubit gates and varying the time delay the gate's action on both qubits can be characterized. Further optimization utilizing INEPT pulse sequences can be used to enhance the insensitivity to exact tuning of the delay time.
         2. Example success criteria can include: (A) Delay times measured during a Ramsey tune-up are compared to calculated wait times, agreement to within a specified window denotes success.
      ii. Tunable qubit designs
         1. Fast actuation
            a. Similar to the above measurement of 5.c.i.1.a the gate is implemented by allowing the two qubits to interact for a specified amount of time. However, with a tunable qubit one can significantly change interaction between qubit A, the tunable qubit, and qubit B, the other qubit. A π pulse is first sent to qubit A putting it into its excited state. Subsequently, a fast DC pulse is sent to the flux port of qubit A, this approximately square pulse tunes the qubit between a parking flux and an interaction flux. By varying the interaction flux and the interaction time the states of both qubit A and qubit B can be measured. For fixed interaction flux set points resonant swapping of which qubit is excited in a Rabi flopping manner. The frequency of these Rabi Flops can be maximized exactly when the interaction flux point brings qubit A into resonance with qubit B.
         2. Example success criteria can include: (A) Successive Rabi flopping curves may need to show good fit to the state of each qubit versus the interaction time. (B) A maximum swapping Rabi frequency must occur. Criteria (A) and (B) may need to be both be satisfied.
6. Multi qubit benchmarking
   a. Variations of randomized benchmarking
      i. Similar to 3.f. a randomized benchmarking can be performed which intersperse two qubit swap gates throughout a randomized benchmarking sequence. Constructing a two qubit randomized benchmarking sequence is then a matter of following the excitation sequence, but assigning gates to different qubits based on the position of the randomized two qubit swaps. By bounding how often swaps can occur, an idle qubit can have short sequences of single qubit randomized benchmarking which returns the idle qubits back to their ground state in time to meet their randomly scheduled swaps.
      ii. Example success criteria can include: (A) A decay curve is fit to a single qubit gate fidelity number this number is compared to a fixed minimum achievable fidelity. (B) This experiment is repeated with different numbers of two qubit swaps used, the lower fidelity puts a bound on the two qubit gate fidelity. Criteria (A) and (B) may need to be both be satisfied.
   b. Optimized gates set tomography
      i. Similar to 3.g.ii Gate set tomography is taken with a reduced gate set.
      ii. Example success criteria can include: (A) A minimum fidelity for each gate may need to be met.

In the following text, additional example experiments are described. Each experiment provides an example of operations to perform all or part of an initialization or calibration process. A central server or other processor can dispatch the processes to sub-processing units or domain control subsystems that operate a domain in a quantum processor cell. In each experiment, the qubits and their measured properties, whose design parameters have been journaled, may be compared and evaluated. The step-by-step process coupled with the computing architecture may allow for the tune-up of large scale superconducting quantum circuit systems.

Some implementations of a two-qubit entangling gate using an alternating fixed-tunable architecture involves adiabatically tuning a flux-tunable transmon such that the two-qubit |1,1> state approaches resonance with the |0,2> state. In this notation, |f,t> indexes the fixed (f) and tunable (t)

qubits. Examples of two-qubit entangling gates using a fixed-frequency qubit device and a tunable-frequency qubit device are described in the publication "Parametrically Activated Entangling Gates Using Transmon Qubits" by S. Caldwell, et al., arXiv:1706.06562 [quant-ph], Jun. 20, 2017. In some implementations, an automated process is used for discovering the parameters for such entangling gates. In particular, such parameters can include quantum logic control parameters; as an example, the quantum logic control parameters can include a parameter for a flux pulse configured to implement a controlled-phase (CPHASE) interaction.

In order to find the operating point for a given interaction (for example, a controlled-phase interaction) the follow may need to be determined: (1) the parking point for the tunable qubit, (2) the fast flux pulse amplitude required to throw the qubit to a given interaction location, (3) the fast flux pulse duration that results in a $\pi$ phase accumulation on the $|11\rangle$ state, and (4) the phases accumulated by the $|01\rangle$ and $|10\rangle$ states during the interaction. The term "zeta" can be referenced herein to refer to the rate of entangling phase accumulation in the CPHASE interaction, e.g., the rate at which the $|11\rangle$ state acquires a phase that may not be acquired by states $|01\rangle$ or $|10\rangle$. In some cases, a calibration process includes one or more of the following steps performed in the following order or in another order:

(1) For the determination of the parking point, flux bias automation can be used to measure the frequency versus flux bias of the tunable qubit. The bias point can be chosen giving the tunable parking frequency, such as the maximum or minimum of the frequency curve.

Figure 5:
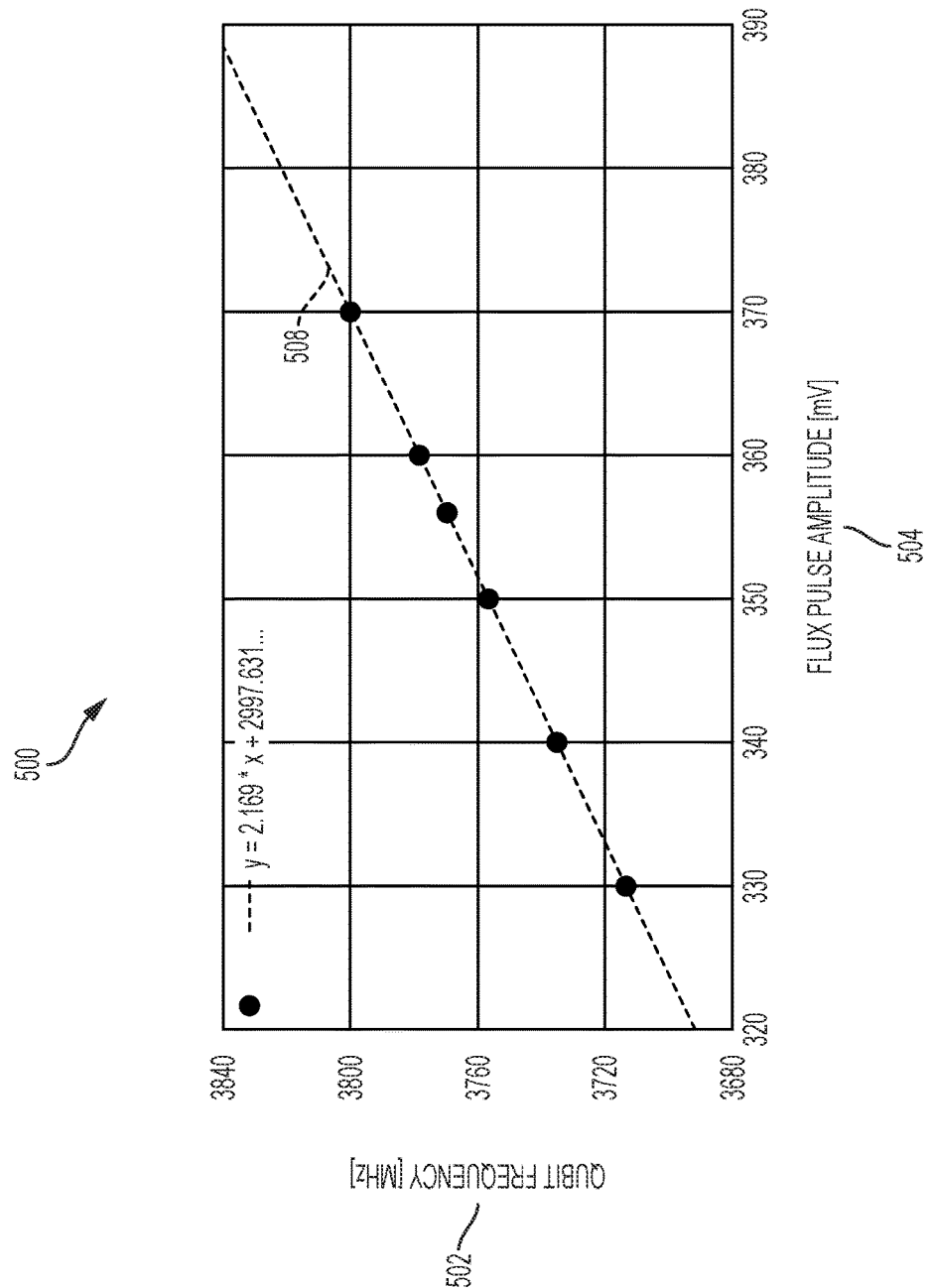
FIG. 5 is a plot of a qubit frequency versus a flux pulse.

(2) For the determination of the flux pulse amplitude, the follow can be performed.
  (a) The zeta versus flux bias data can be taken from flux bias automation to estimate the desired frequency for the tunable qubit during the gate.
  (b) A measurement such as a flux-time Ramsey measurement can be used to measure the tunable qubit frequency as a function of flux pulse amplitude.
  (c) Step (b) can be repeated for several values of amplitude to sample the frequency versus the amplitude, as shown in FIG. 5.
  (d) This data can be interpolated to identify the amplitude giving the desired frequency.
  (e) The desired zeta can be verified by performing a zeta measurement (for example, by measuring the frequency of the tunable qubit with the neighbor in both 0 and 1 states, as the zeta is the difference of the two frequencies). If necessary, the pulse amplitude can be fine-tuned to obtain the desired zeta.

(3) For the determination of the flux pulse duration, the following can be performed.
  (a) The desired phase can be used to estimate the corresponding gate time using the formula: (desired phase)=zeta*(duration).
  (b) For times near the estimated duration, steps 1-3 in FIG. 6 (described below) can be followed.

(4) For the $|01\rangle$ and the $|10\rangle$ phases, step 4 in FIG. 6 (described below) can be followed. Accordingly, the information for the CPHASE can be known for the desired phase angle.

In some implementations, the above technique can be adapted to other physical implementations of CPHASE interactions, beside the use of a flux pulse on a tunable qubit. Such additional implementations can include considerations of how the underlying zeta depends on the implementation. For example, phase tomography, which can be used to find the $|01\rangle$ and $|10\rangle$ phases, can also be extended to another CPHASE gate discovery procedure.

FIG. 5 shows a plot 500 of the qubit frequency in units of megahertz on the y-axis 502 versus the flux pulse amplitude in units of millivolts on the x-axis 504. For the example plot 500, the flux pulse amplitude can range from approximately 320 millivolts to approximately 390 millivolts, and the qubit frequency can range from approximately 3680 megahertz to approximately 3840 megahertz. For the example plot 500, the line 508 characterized by y=2.169*x+2997.631 can be used to fit the points of the plot 500.

Figure 6:
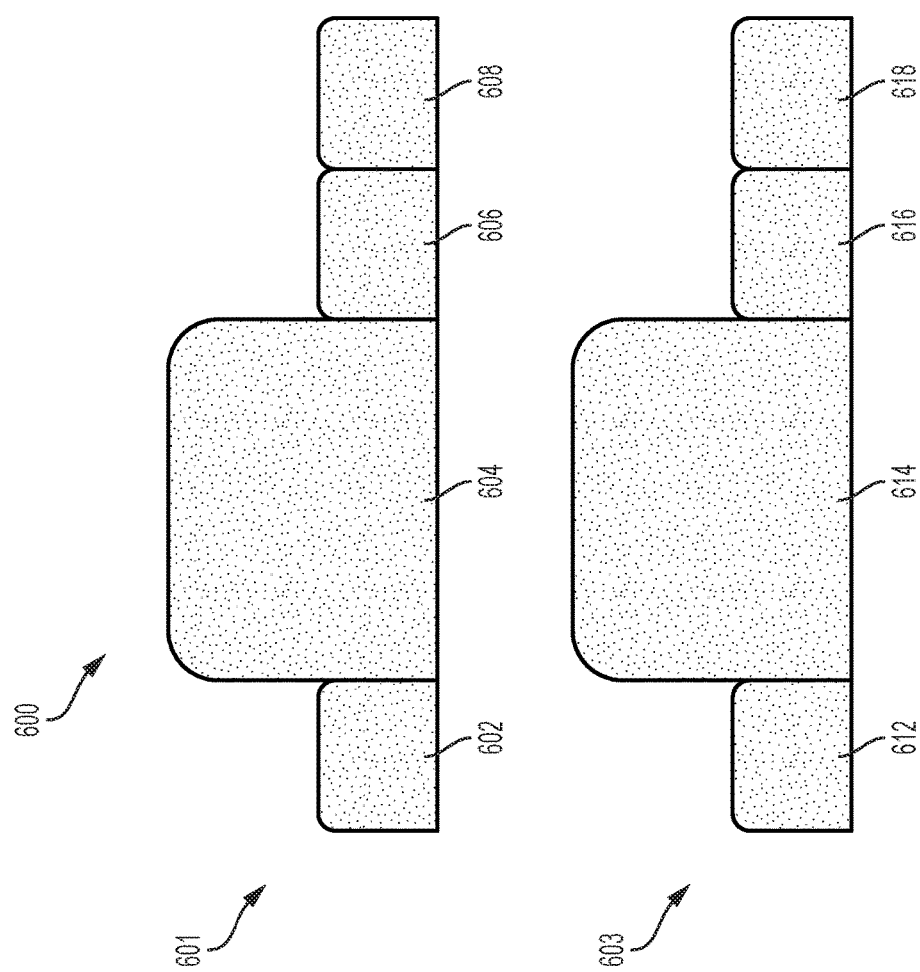
FIG. 6 is a diagram of an example gate tune-up process.

FIG. 6 shows a diagram 600 representing example CZ gate tune-up processes 601 and 603. In some implementations, the processes can use phase tomography to obtain phases for qubits. The x-axis can represent phase, and the y-axis can represent amplitude. In particular, process 601 can include a +X/2 phase 602, a +F variable duration r phase 604, a +X/2 phase 606, and a readout (RO) phase 608. Further, process 603 can include a +X/2 phase 612, a +F variable duration $\tau$ phase 614, a +Y/2 phase 616, and a RO phase 618.

In a first step, phase tomography on fixed transmons can be performed. Accordingly, the phase tomography on fixed transmons can be tunable in the zero state. This can allow for the determination of $\phi_{10}(\tau)$.

In a second step, phase tomography on fixed transmons can be performed. Accordingly, the phase tomography on fixed transmons can be tunable in the one state. This can allow for the determination of $\phi_{10}(\tau)+\phi_{CZ}(\tau)$.

In third step, a subtraction of the phases determined above can be performed. Accordingly, $\tau^*$ can be determined, where $\phi_{CZ}(\tau^*)=\pi$. This can allow for the additional determination of $\phi_{10}(\tau^*)$, where $\tau^*$ is the CZ pulse duration.

In a fourth step, phase tomography on tunable transmons can be performed. Accordingly, $\phi_{10}(\tau)$ can be obtained and $\phi_{01}(\tau^*)$ can be determined. In some implementations, the CZ gate can thereby be obtained. Thus, the amplitude and duration, $\phi_{10}$, $\phi_{01}$, and $\phi_{CZ}$ for the CZ can be thereby obtained.

In some implementations, flux bias automation is used for tunable qubit bring-up. In one implementation, the flux bias automation can include the calibration and characterization of a tunable qubit as a function of a (1) slow (for example, direct current) flux bias, that is, a flux bias voltage or current that is held constant during a set of measurements, or (2) measurements of tunable qubits as a function of fast flux amplitude and fast flux modulation frequency.

Figure 7:
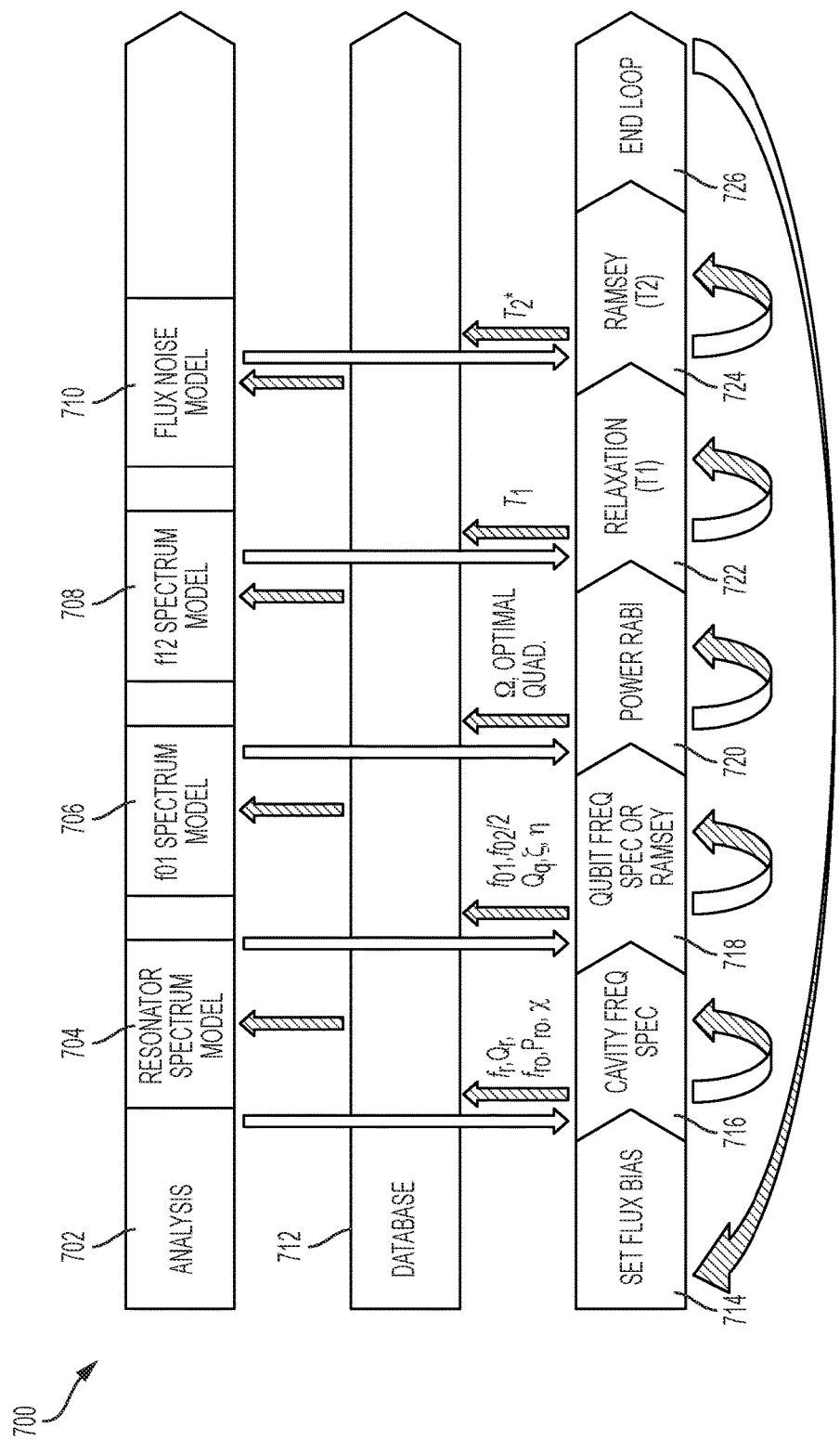
FIG. 7 is a diagram of an example process for flux bias automation (FBA).

In some implementations, flux bias automation (FBA) can refer to a set of measurements that are performed in a specific sequence within a loop over DC flux bias values, with a specific data flow, as shown in FIG. 7 (described in further detail below). In particular, FIG. 7 shows a diagram 700 of a process for flux bias automation. In some implementations, domains can be updated, where the domains can include at least one flux-tunable qubit device; further, sets of measurements can be obtained by performing a measurement sequence within a loop over multiple flux bias values for the flux-tunable qubit device.

In some implementations, when the flux bias is changed, a subset of measurements is performed which can be referred to as repark flux bias and can include (reference to various elements in FIG. 7 are made herein):

1) Updating the readout point
  a) A low-power readout can be updated by performing low-power cavity spectroscopy 716 and updating the readout frequency to a given point relative to the cavity peaks with the qubit in the 0 or 1 state.

b) A high-power readout can be updated by performing a cavity power scan at the high-power cavity frequency with both 0 and 1 qubit preparations, and by determining the power at which the difference of the two transmission measurements is maximized.

c) The updated readout power or frequency can be saved to the database 712.

2) Updating the qubit frequencies a) Qubit spectroscopy or Ramsey frequency measurement 718 can be performed to obtain the qubit frequency at the new flux bias.

b) The qubit frequency at the new flux bias can be saved to the database 712.

c) The qubit $f_{02}/2$ can be measured using high-power qubit spectroscopy.

d) The qubit frequency with any neighboring qubits of interest (for example, for use in two-qubit gates) prepared in their 1 states can be measured.

e) These frequencies or their differences (for example, qubit-qubit dispersive coupling, e.g., zeta's) from the frequency found in (a), can be saved to the database, indexed by the neighbor id.

3) Updating the readout optimal quadrature a) A power Rabi measurement 720 can be performed and the optimal readout quadrature can be identified. In one implementation, the principal component of the in-phase and quadrature (IQ) data to find the axis in the IQ plane along which the sensitivity of the readout to the qubit state is maximized.) This axis can then be updated.

b) The updated optimal quadrature data can be saved to the database 712.

In some implementations, model and bootstrapping technique for choosing how to automatically construct the qubit frequency measurements is described below. In FBA, the relaxation and coherence times can be measured. With updated readout and gate parameters, the coherence properties of the qubit can be characterized as follows.

1) T1 can be measured 722 and stored in the database 712.

2) T2* can be measured (for example, using Ramsey technique 724) and can be stored in the database 712.

3) T2 echo (for example, including an extra π pulse during a Ramsey wait) can be measured and stored in the database.

4) Step (3) can be repeated for additional n-π pulses. This can be implemented as a Car-Purcell-Meiboom-Gill (CPMG) experiment. The decay time for the n π-pulses can be stored in the database 712.

In some implementations, the T2 measurements are constructed such that the fitting returns valid results. In some implementations, this process can provide optimizing gates and performing benchmarking. In some cases, the gates can be optimized, and benchmarking can be performed using one or more of the following steps in the order described or in another order:

1) An automated 1-qubit gate tune-up can be performed.

2) A 1-qubit randomized benchmarking process can be performed.

3) A 1-qubit gate set tomography can be performed.

a) Other automated fine-tuning and benchmarking processes can be performed, including, for example, Josephson parametric amplifier (JPA) optimization.

b) Readout point fine-tuning can be performed.

As the DC flux bias of the target is changed, the measured parameters can be stored in a flux dependence table in the database. This can allow for the improvement of interpolation and/or extrapolation, and initial parameter guessing procedures.

(1) To determine the flux bias value that coarsely corresponds to one flux quantum, a cavity spectroscopy can be performed as a function of slow flux bias. This can be used in connection with the spectrum model for extrapolation, as its flux bias value may be sensitive to the initial value of flux bias period.

(2) After measuring transition frequency $f_{01}$ ($f_{12}$) values, the estimated flux bias period can be used to fit the $f_{01}$ ($f_{12}$) spectrum model. The estimated flux bias period can then be extrapolated by evaluating the model at the subsequent slow flux or fast flux value.

In some implementations, additional measurements can be included in the flux bias automation, for example:

(1) Single-qubit gate optimization at slow flux bias points.

(2) Single-qubit randomized benchmarking at slow flux bias points.

In some implementations, retrying schemes can be implemented for many of the measurements in the flux bias automation, for example:

(1) Ramsey measurements can determine success criteria based on the standard error of the mean of the parameters estimated by one or more fitting models. If the standard error falls outside of acceptable tolerance ranges, the Ramsey experiment can be performed again with a larger detuning, smaller span, and smaller step size.

In addition to measurements as a function of slow flux, tunable qubits can be characterized as a function of fast flux amplitude (with fixed slow flux) and as a function of flux modulation frequency (with fixed slow flux and fast flux amplitude). This allows determination of the following:

(1) Fast flux pulse throw as a function of flux pulse amplitude.

(2) Qubit-qubit dispersive coupling (zetas) as a function of flux pulse amplitude.

(3) Coherence times during fast flux and parametric flux pulse.

(4) Modulation detuning as a function of flux pulse amplitude and frequency.

In addition to fitting the qubit $f_{01}$ spectrum model, the data collected by these automation procedures can be used to extract other design parameters:

(1) Resonator frequency vs. slow flux bias.

(2) Effective qubit frequency vs fast flux amplitude at fixed modulation frequency.

(3) A direct current crosstalk matrix.

(4) A qubit-qubit dispersive coupling (zeta) matrix.

(5) A flux noise model.

(6) Anharmonicity vs slow flux bias.

For chips with multiple tunable qubits, current on one flux bias line can change the frequencies of other qubits on the same chip, which can be characterized by a DC crosstalk matrix. One or more of the following steps may be performed in the following order or in another order:

1) A flux-bias point of high sensitivity can be chosen to incremental flux bias for the tunable qubits.

2) The flux bias on the flux bias lines can be incremented. For each increment the qubit frequency of the (tunable) qubits on the chip can be measured.

3) A two-dimensional matrix (in units of delta-frequency/delta-flux) can be obtained.

4) Using the known frequency curve of each qubit (known from FBA), this matrix can be converted to units of delta-bias (qubit 1)/delta-bias (qubit 2), which can be dimensionless and constant across biases.

5) This matrix can be stored in a database.

In some implementations, the frequency measurements are bootstrapped, for example, using one or more of the following steps in the following order or in another order:

1) Starting at zero flux (which can correspond to the maximum frequency), a small step in positive flux and a small step in negative flux can be taken. "Small" can mean that the shifted qubit frequency at the new flux values can still be captured in the same, or a predictable, frequency span as the qubit spectroscopy measurement used to capture the qubit frequency at zero flux.
2) These first three frequencies can be fitted to a quadratic model and the fit can be used to extrapolate the frequencies at a further point in the positive and negative flux directions.
3) Now with five frequency points, the frequencies can be refitted to a quadratic model and extrapolated again.
4) The frequencies can be refitted until there are approximately ten frequencies. Then the tunable transmon frequency model can be used to extrapolate and update the tunable transmon Hamiltonian parameters in the database.
5) Some of these steps can be repeated if new frequency measurements are being obtained.

In some implementations, a Ramsey measurement is built, for example, using one or more of the following operations:

1) For T2
   a) Guess what T2 will be (T2_guess).
      i) Extrapolate from previous trend, for example, by using an averaging filter to reduce noise.
   b) Set the time span from 0 to 4*T2_guess.
   c) Set the detuning of the reference frame to 1/T2_guess.
   d) Set the time step to 0.1/T2_guess.
2) For frequency
   a) Guess what the frequency will be.
   b) Set the time span to an approximately 100 ns window near zero.
   c) Set the time step to approximately 1 ns. This can imply a measurement bandwidth of approximately 100 MHz.
   d) Set the detuning of the reference frame to approximately 50 MHz away from the guessed frequency.
   e) This gives sensitivity to frequencies within approximately 50 MHz of the guessed frequency.

FIG. 7 shows a diagram 700 of a process for flux bias automation. In some implementations, the process includes performing a set of measurements in a particular sequence within a loop over DC flux bias values and with a specific data flow. In particular, diagram 700 includes an analysis 702 process, a resonator spectrum model 704, a $f_{01}$ spectrum model 706, a $f_{12}$ spectrum model 708, and a flux noise model 710. Diagram 700 further includes a database 712. Diagram 700 further includes a set flux bias 714 process, cavity frequency spectroscopy 716 process, qubit frequency spectroscopy or Ramsey spectroscopy 718 process, a power Rabi spectroscopy 720 process, a relaxation (T1) 722 process, a Ramsey (T2) 724 process, and an end loop 726 process.

Some processes shown in FIG. 7 include performing a low-power readout from a low-power cavity spectroscopy 716 and updating the readout frequency to a given point relative to cavity peaks associated with the qubit. Additionally, FIG. 7 includes a process of performing a low-power readout from a low-power cavity spectroscopy 716. Moreover, FIG. 7 can further include determining a resonance frequency $f_r$, a quality factor ($Q_r$), a readout frequency ($f_{ro}$), a readout power ($P_{ro}$), and a coupling parameter $\chi$. The various parameters, including the readout power and the readout frequency can be saved to the database 712.

FIG. 7 includes a process of performing a qubit spectroscopy or Ramsey frequency measurement 718, for example, to obtain the qubit frequency at a given flux bias. Additionally, a frequency $f_{01}$, a frequency $f_{02}/2$, the circuit bandwidth (or linewidth) $Q_q$, the qubit-qubit dispersive shift $\zeta$, and anharmonicity $\eta$ can be obtained. The various parameters, for example, the qubit frequency at the flux bias can be saved to the database 712.

FIG. 7 further includes a process of performing a power Rabi measurement 720 and identifying the optimal readout quadrature. Additionally, the Rabi oscillation rate $\Omega$ can be determined. The updated optimal quadrature data can be saved to the database 712. FIG. 7 additionally shows that T1 can be measured 722 and stored in the database 712. Further, T2* can be measured (using Ramsey technique 724) and stored in the database 712.

In some implementations, the database 712 can be in communication with a processor that can perform or apply one or more of an analysis 702 process, a resonator spectrum model 704, a $f_{01}$ spectrum model 706, a $f_{12}$ spectrum model 708, and a flux noise model 710. The database 712 can supply the processor and the models described above with various parameters obtained in processes 714-726.

In some implementations, a calibration process can provide technical advantages for operating a quantum computing system. For instance, the calibration process may provide reliable results by applying well-defined criteria for pass/fail during calibration of superconducting qubits. Design expectations may be used to execute an automated calibration process, providing initial values and the basis of several pass/fail criteria. A calibration routine may be implemented in a manner that is robust to many types of device failure. A computer program with a defined experimental procedure may control the calibration process, which can increase efficiency and consistency while reducing opportunities for error. In some cases, the calibration process can be applied to a very large number of qubits simultaneously, which can enable large-scale quantum computing in some systems. The calibration process may reduce the time used to characterize a device and shorten the design-fabricate-measure cycle.

In some aspects, a computer system controls one or several instruments to generate or measure signals, and an automated calibration process determines one or several control parameters or device characteristics of a specific device under test. The control parameters and device characteristics can be stored in a database. One or more measurement steps can be performed. An experimental procedure can define the order of measurement steps. The experimental procedure can include modular sub-procedures that can be reused or run independently. A measurement step can further include a computerized routine to extract relevant control parameters and device characteristics. A measurement step can further include a computerized routine that determines the "result" of the measurement, where the result includes one or more of: a pointer to the next measurement step in the experimental procedure; a repetition of the current measurement with different parameters; a failure condition which terminates the characterization and calibration cycle; or a success condition which terminates the characterization cycle. Termination in success or failure can trigger a human-readable alert to a configurable set of people. The alert can be sent via email (e.g. SMTP), instant message (e.g. Skype, IRC, Slack), or otherwise. The routine can further include a statistical goodness of fit metric with a defined threshold. The quality of fit metric can include the reduced residual chi-square statistic, the Akaike Information Criterion statistic, the Bayesian Information Criterion statistic or another fit metric. The routine can further include a machine learning algorithm that has been trained, for example, on human-classified measurement results from the same system. The routine can further include one or more statistical goodness of fit metrics with machine learning.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Moreover, a computer can be embedded in another device, e.g., a phone, an electronic appliance, a mobile audio or video player, a game console, a Global Positioning System (GPS) receiver, or a portable storage device (e.g., a universal serial bus (USB) flash drive). Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

In a general aspect, calibration is performed in a quantum computing system.

In a first example, a calibration method includes identifying domains of a quantum computing system by operation of a control system. The domains can include domain control subsystems and subsets of quantum circuit devices in a quantum processor of the quantum computing system. The method can further include obtaining a first set of measurements from a first domain of the domains and storing the first set of measurements in a memory of the control system. The method can include determining, by operation of the control system, device characteristics of the quantum circuit devices of the first domain based on the first set of measurements, and storing the device characteristics in a memory of the control system. The method can further include determining to obtain a second set of measurements from the first domain based on the device characteristics and obtaining the second set of measurements from the first domain. The method can include storing the second set of measurements in the memory of the control system, and determining, by operation of the control system, quantum logic control parameters for the subset of quantum circuit devices of the first domain based on the second set of measurements. The method can further include storing the quantum logic control parameters in a database of the control system for use in operating the first domain.

Implementations of the first example may include one or more of the following features. The domains can be defined in part by hardware, control logic, physical connections, or software in the quantum computing system. The quantum circuit devices of the first domain can include qubit devices and readout devices. The control system can include a controller (where the controller includes a cache), signal conversion circuitry, a filter, and an amplifier. The control system can include an embedded operating system configured to communicate with the database and the controller.

Implementations of the first example may include one or more of the following features. The device characteristics can include resonance frequencies and coherence times for qubit devices in the first domain. The quantum logic control parameters can include read-out pulse parameters or quantum logic gate pulse parameters for qubit devices in the first domain. Further, the method can include repeating the first set of measurements or the second set of measurements based on a success or a failure of a calibration of the first domain of the quantum computing system. The quantum logic control parameters can include a parameter for a flux pulse configured to implement a controlled-phase interaction. The domain can include at least one flux-tunable qubit device. Further, obtaining the first set of measurements can include performing a measurement sequence within a loop over multiple flux bias values for the flux-tunable qubit device.

In a second example, a quantum computing system includes a quantum processor and a control system. The quantum processor includes quantum circuit devices. The control system can be configured to: identify domains of the quantum computing system, the domains comprising respective domain control subsystems and respective subsets of quantum circuit devices. The control system can be further configured to: obtain a first set of measurements from a first domain of the domains; store the first set of measurements in a memory of the control system; determine device characteristics of the quantum circuit devices of the first domain based on the first set of measurements; store the device characteristics in the memory of the control system; and determine to obtain a second set of measurements from the first domain based on the device characteristics. The control system can be configured to: obtain the second set of measurements from the first domain; store the second set of measurements in the memory of the control system; determine quantum logic control parameters for the subset of quantum circuit devices of the first domain based on the second set of measurements; and store the quantum logic control parameters in the database of the control system for use in operating the first domain.

Implementations of the second example may include one or more of the following features. The domains can be defined in part by hardware, control logic, physical connections, or software in the quantum computing system. The quantum circuit devices of the first domain can include qubit devices and readout devices. The control system can include a controller (where the controller includes a cache), signal conversion circuitry, a filter, and an amplifier. The control system can include an embedded operating system configured to communicate with the database and the controller.

Implementations of the second example may include one or more of the following features. The device characteristics can include resonance frequencies and coherence times for qubit devices in the first domain. The quantum logic control parameters can include read-out pulse parameters or quantum logic gate pulse parameters for qubit devices in the first domain. Further, the first set of measurements or the second set of measurements can be repeated based on a success or a failure of a calibration of the first domain of the quantum computing system. The quantum logic control parameters can include a parameter for a flux pulse configured to implement a controlled-phase interaction. The domain can include at least one flux-tunable qubit device. Further, obtaining the first set of measurements can include performing a measurement sequence within a loop over multiple flux bias values for the flux-tunable qubit device.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method comprising:
   identifying domains of a quantum computing system by operation of a control system, the domains comprising respective domain control subsystems and respective subsets of quantum circuit devices in a quantum processor of the quantum computing system;

obtaining, by operation of at least one or more radio frequency or microwave signal generators or receivers of the control system, a first set of measurements from a first domain of the domains;

storing the first set of measurements in a memory of the control system;

determining, by operation of the control system, device characteristics of the subset of quantum circuit devices of the first domain based on the first set of measurements;

storing the device characteristics in the memory of the control system;

determining to obtain a second set of measurements from the first domain based on the device characteristics;

obtaining, by operation of at least one or more radio frequency or microwave signal generators or receivers of the control system, the second set of measurements from the first domain;

storing the second set of measurements in the memory of the control system;

determining, by operation of the control system, quantum logic control parameters for the subset of quantum circuit devices of the first domain based on the second set of measurements; and storing the quantum logic control parameters in a database of the control system for use in operating the first domain.

2. The method of claim 1, wherein the domains are defined in part by hardware, control logic, physical connections, or software in the quantum computing system.

3. The method of claim 1, wherein the quantum circuit devices of the first domain include qubit devices and readout devices.

4. The method of claim 1, wherein the control system comprises a controller, the controller including a cache, signal conversion circuitry, a filter, and an amplifier.

5. The method of claim 4, wherein the control system comprises an embedded operating system configured to communicate with the database and the controller.

6. The method of claim 1, wherein the device characteristics comprise resonance frequencies and coherence times for qubit devices in the first domain.

7. The method of claim 1, wherein the quantum logic control parameters comprise read-out pulse parameters or quantum logic gate pulse parameters for qubit devices in the first domain.

8. The method of claim 1, wherein the method further comprises repeating the first set of measurements or the second set of measurements based on a success or a failure of a calibration of the first domain of the quantum computing system.

9. The method of claim 1, wherein the quantum logic control parameters comprise a parameter for a flux pulse configured to implement a controlled-phase interaction.

10. The method of claim 1, wherein the domain comprises at least one flux-tunable qubit device and obtaining the first set of measurements comprises performing a measurement sequence within a loop over multiple flux bias values for the flux-tunable qubit device.

11. A quantum computing system comprising:
a quantum processor comprising quantum circuit devices; and
a control system configured to perform operations comprising:

identifying domains of the quantum computing system, the domains comprising respective domain control subsystems and respective subsets of the quantum circuit devices;

obtaining, by operation of at least one or more radio frequency or microwave signal generators or receivers of the control system, a first set of measurements from a first domain of the domains;

storing the first set of measurements in a memory of the control system;

determining device characteristics of the subset of quantum circuit devices of the first domain based on the first set of measurements;

storing the device characteristics in the memory of the control system;

determining to obtain a second set of measurements from the first domain based on the device characteristics;

obtaining, by operation of at least one or more radio frequency or microwave signal generators or receivers of the control system, the second set of measurements from the first domain;

storing the second set of measurements in the memory of the control system;

determining quantum logic control parameters for the subset of quantum circuit devices of the first domain based on the second set of measurements; and storing the quantum logic control parameters in a database of the control system for use in operating the first domain.

12. The system of claim 11, wherein the domains are defined in part by hardware, control logic, physical connections, or software in the quantum computing system.

13. The system of claim 11, wherein the quantum circuit devices of the first domain include qubit devices and readout devices.

14. The system of claim 11, wherein the control system comprises a controller, the controller including a cache, signal conversion circuitry, a filter, and an amplifier.

15. The system of claim 14, wherein the control system comprises an embedded operating system configured to communicate with the database and the controller.

16. The system of claim 11, wherein the device characteristics comprise resonance frequencies and coherence times for qubit devices in the first domain.

17. The system of claim 11, wherein the quantum logic control parameters comprise read-out pulse parameters or quantum logic gate pulse parameters for qubit devices in the first domain.

18. The system of claim 11, wherein the control system is configured to repeat the first set of measurements or the second set of measurements based on a success or a failure of a calibration of the first domain of the quantum computing system.

19. The system of claim 11, wherein the quantum logic control parameters comprise a parameter for a flux pulse configured to implement a controlled-phase interaction.

20. The system of claim 11, wherein the domain comprises at least one flux-tunable qubit device and obtaining the first set of measurements comprises performing a measurement sequence within a loop over multiple flux bias values for the flux-tunable qubit device.

* * * * *

UNITED STATES PATENT AND TRADEMARK OFFICE
CERTIFICATE OF CORRECTION

PATENT NO.         : 10,282,675 B2
APPLICATION NO.    : 15/916367
DATED              : May 7, 2019
INVENTOR(S)        : Bloom et al.

Page 1 of 1

It is certified that error appears in the above-identified patent and that said Letters Patent is hereby corrected as shown below:

In the Specification

Column 22, Line 17, delete "r" and insert -- $\tau$ -- therefor.

Column 22, Line 35, delete "$\phi_{10}(\tau)$" and insert -- $\phi_{01}(\tau)$ -- therefor.

Signed and Sealed this
Twenty-fifth Day of June, 2019

Andrei Iancu
*Director of the United States Patent and Trademark Office*